United States Patent
Liu et al.

(10) Patent No.: US 9,759,947 B2
(45) Date of Patent: Sep. 12, 2017

(54) WIRE GRID POLARIZER AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Kairan Liu, Beijing (CN); Yanbing Wu, Beijing (CN); Wenbo Li, Beijing (CN); Xiangyan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 14/892,257

(22) PCT Filed: May 15, 2015

(86) PCT No.: PCT/CN2015/079013
§ 371 (c)(1),
(2) Date: Nov. 19, 2015

(87) PCT Pub. No.: WO2016/086609
PCT Pub. Date: Jun. 9, 2016

(65) Prior Publication Data
US 2016/0357063 A1 Dec. 8, 2016

(30) Foreign Application Priority Data
Dec. 4, 2014 (CN) .......................... 2014 1 0734451

(51) Int. Cl.
*G02F 1/1335* (2006.01)
*G02F 1/1368* (2006.01)
(Continued)

(52) U.S. Cl.
CPC ......... *G02F 1/133528* (2013.01); *G02B 5/30* (2013.01); *G02B 5/3058* (2013.01);
(Continued)

(58) Field of Classification Search
CPC ............. G02F 1/133528; G02F 1/1335; G02F 1/1368; G02F 2001/133548; G02B 5/30; G02B 5/3058; H01L 27/1214
(Continued)

(56) References Cited

U.S. PATENT DOCUMENTS

2006/0215263 A1* 9/2006 Mi ....................... G02B 5/3058
359/485.05
2008/0100779 A1* 5/2008 Choo ................... G02B 5/3058
349/96
(Continued)

FOREIGN PATENT DOCUMENTS

CN 1945398 4/2007
CN 101515045 8/2009
(Continued)

*Primary Examiner* — Frank Font
(74) *Attorney, Agent, or Firm* — Harness, Dickey & Pierce, P.L.C.

(57) ABSTRACT

The invention relates to the display technology field, and particularly to a wire grid polarizer, a manufacturing method thereof, a display panel and a display device. The wire grid polarizer comprises a substrate, in which wire grid structures are arranged at intervals in an array, to allow light to penetrate from the grid pitches thereof, with the other area except the wire grid structures of the substrate being a continuous opaque area. Due to the wire grid polarizer being provided with the wire grid structures arranged at intervals in a array, local light transmitting areas can be formed, and light emergence can be controlled more flexibly. A display panel using the wire grid polarizer can effectively lower the light absorption rate, also avoid peripheral light leakage in a non-subpixel area, and prevent the light leakage of the pixels themselves; correspondingly, a display device using the display panel can improve the light utilization rate, and achieve a good display effect.

19 Claims, 3 Drawing Sheets

(51) Int. Cl.
*H01L 27/12* (2006.01)
*G02B 5/30* (2006.01)

(52) U.S. Cl.
CPC ...... *G02F 1/1368* (2013.01); *G02F 1/133536* (2013.01); *H01L 27/1214* (2013.01); *G02F 2001/133548* (2013.01)

(58) Field of Classification Search
USPC .................... 359/485.05, 487.03; 349/96
See application file for complete search history.

(56) References Cited

U.S. PATENT DOCUMENTS

| | | | | |
|---|---|---|---|---|
| 2008/0137010 A1* | 6/2008 | Kumai | ............... | G02B 5/3058 349/96 |
| 2009/0046362 A1* | 2/2009 | Guo | ............... | B82Y 40/00 359/485.05 |
| 2010/0134719 A1* | 6/2010 | Johns | ............... | C23C 14/02 349/62 |
| 2010/0259821 A1* | 10/2010 | Kaida | ............... | C08F 2/44 359/485.05 |
| 2010/0328768 A1* | 12/2010 | Lines | ............... | G02B 5/0252 359/485.05 |
| 2012/0250154 A1* | 10/2012 | Davis | ............... | B82Y 20/00 359/485.05 |
| 2013/0120698 A1 | 5/2013 | Takakuwa et al. | | |
| 2013/0182405 A1* | 7/2013 | Kaufman | ............ | G02F 1/13439 362/19 |
| 2013/0201557 A1* | 8/2013 | Davis | ............... | G02B 5/3058 359/486.01 |
| 2013/0300986 A1 | 11/2013 | Kang | | |
| 2014/0028956 A1 | 1/2014 | Choi et al. | | |
| 2014/0055715 A1 | 2/2014 | Lee et al. | | |
| 2014/0110040 A1* | 4/2014 | Cok | ............... | G02F 1/133524 156/182 |
| 2014/0133027 A1 | 5/2014 | Jang et al. | | |
| 2015/0028296 A1* | 1/2015 | Jeong | ............... | H01L 51/5281 257/40 |

FOREIGN PATENT DOCUMENTS

| | | |
|---|---|---|
| CN | 201654386 | 11/2010 |
| CN | 101963719 | 2/2011 |
| CN | 102405436 | 4/2012 |
| CN | 102914901 | 2/2013 |
| CN | 104459863 | 3/2015 |
| CN | 204215062 | 3/2015 |

* cited by examiner

WIRE GRID POLARIZER AND MANUFACTURING METHOD THEREOF, DISPLAY PANEL AND DISPLAY DEVICE

TECHNICAL FIELD

The invention relates to the display technical field, and particularly to a wire grid polarizer and a manufacturing method thereof, a display panel and a display device.

BACKGROUND OF THE INVENTION

A liquid crystal display (LCD for short) is a kind of flat display devices, with an LCD panel and a backlight source as important components thereof. The LCD is formed by setting a backlight source on one side of an LCD panel to achieve image display.

An LCD panel comprises a color film substrate, an array substrate and a liquid crystal (LC) layer disposed between them, with a backlight source disposed at the side close to the array substrate. To achieve image display, the array substrate is provided with thin film transistors (TFT for short), with the control terminals thereof receiving control signals and display signals respectively, and implementing the on/off control of the TFTs according to the control signals and the display signals, so as to drive the LC, eventually controlling deflection of the LC to achieve controlling the light beams from the backlight source; meanwhile, to achieve colorization of the display image, the color film substrate is provided with a color film layer.

Often, both sides of an LCD panel are provided with a polarizer respectively, wherein, a upper polarizer is attached onto the color film substrate, and is disposed opposite to a color film layer; a lower polarizer is attached onto the array substrate, and is disposed opposite to the TFTs. Due to the setting of the upper polarizer and the lower polarizer, only the light beams vibrating in a particular direction of the light beams from the backlight source can pass through; while controlling the light beams vibrating in a particular direction to pass, the lower polarizer also has an absorption effect for the light. In general, the lower polarizer can only allow penetration of light of no more than 50%, with the rest being absorbed, thus causing low light utilization of the LCD.

Therefore, designing a display panel to improve the light utilization has now become an urgent technical problem that need to be solved.

SUMMARY OF THE INVENTION

To overcome the above drawbacks in the prior art, an embodiment of the invention provides a wire grid polarizer and a manufacturing method thereof, a display panel and a display device, the wire grid polarizer having wire grid structures arranged at intervals in an array. The display panel can effectively lower the light absorption rate, and can further avoid peripheral light leakage in a non-subpixel area, and prevent light leakage of the pixels themselves.

The embodiment of the invention provides a wire grid polarizer, comprising a substrate, wherein, multiple open areas are formed at intervals in an array mode, the wire grid polarizer further comprises multiple wire grid (WG for short) structures arranged in the open areas respectively, each of the WG structures comprises multiple grid lines disposed at intervals, the intervals between two adjacent grid lines form grid pitches of the WG structures, and the WG structures allow light to penetrate through the grid pitches thereof, and the other area except the open areas of the substrate is a continuous opaque area.

In the WG structures, the width of the grid lines may range 25-250 nm, the width of the grid pitches may range 25-250 nm.

The substrate may be made with a metal material.

The metal material may comprise silver or aluminum.

The WG structures may be formed with the substrate as a whole, the thickness of the substrate may range 20-250 nm, the thickness of the grid lines for the WG structure may range 20-250 nm.

An embodiment of the invention also provides a method for manufacturing a wire grid polarizer, which is the wire grid polarizer described above provided by the embodiment of the invention, the method may comprise the following steps:

Step S1, forming a transparent supporting layer on a base;

Step S2, heating the supporting layer to make the temperature of the supporting layer higher than the temperature of the glass phase transition point of the supporting layer;

Step S3, pressing a pressing template into the supporting layer with a preset pressure, the pressing template being prefabricated with pressing patterns corresponding to the patterns of the WG structures disposed at intervals;

Step S4, maintaining the preset pressure, cooling the supporting layer down to below the temperature of the glass phase transition point of the supporting layer, removing the pressing template, and forming raised areas and depressed areas on the supporting layer, with the raised areas corresponding to the grid pitches, while the depressed areas comprising portions corresponding to the grid lines and a portion corresponding to the continuous opaque area;

Step S5, removing the portions of the supporting layer corresponding to the depressed areas to expose the base of the corresponding areas, thus forming masking patterns on the base in the same patterns as the WG structures using the supporting layer;

Step S6, forming a layer of opaque material on the exposed base and the masking patterns;

Step S7, removing the masking patterns and the opaque material attached onto the masking patterns, so as to form the wire grid polarizer.

In Step S1, the material forming the supporting layer may comprise any one of polymethyl methacrylate, polycarbonate, polystyrene, cycloolefin resin and cross-linked polyethylene; the supporting layer is formed by spin coating, and the thickness of the supporting layer may range 0.1-0.3 µm.

In Step S1, the supporting layer may be formed with polymethyl methacrylate, the temperature of the glass phase transition point of which may be 105° C.; in Step S2, the heating temperature of the supporting layer may range 180-220° C.

In Step S3, the pressing template may be formed with a silica material, the width of the portions, corresponding to the grid lines of the WG structures, of the pressing patterns of the pressing template may range 25-250 nm, and the width of the portions, corresponding to the grid pitches of the WG structures, of the pressing patterns of the pressing template may range 25-250 nm, the depth of the portions, corresponding to the grid pitches of the WG structures, of the pressing patterns of the pressing template may range 20-250 nm; the preset pressure may range 12-14 MPa.

In Step S5, the supporting layer may be etched by means of oxygen reactive ion etching, until the depressed areas, corresponding to the grid lines and the continuous opaque area of the WG structures, of the supporting layer, expose the base of the corresponding areas.

In Step S6, the opaque material may be a metal material, and the opaque material layer may be formed above the supporting layer by sputter deposition.

The metal material may comprise aluminum or silver, and an aluminum layer or a silver layer may be formed above the supporting layer by sputter deposition.

In step S7, the masking patterns and the opaque material attached onto the masking patterns may be removed by dissolution, so as to form the wire grid polarizer.

An embodiment of the invention also provide a display panel, comprising an active area, which comprise multiple sub-pixel areas arranged at intervals, and an inactive area surrounding the active area, wherein, the area of the display panel corresponding to the active area is provided with the wire grid polarizer provided in the invention, and the areas of the wire grid polarizer corresponding to the sub-pixel areas are the WG structures.

The display panel may comprise a first substrate plate and a second substrate plate arranged opposite to each other, the areas, corresponding to the sub-pixel areas, of the first substrate plate or the second substrate plate are provided with multiple color film patterns of multiple different colors, and the WG structures are correspond one-to-one to the color film patterns.

The color film patterns may comprise color resistive layers, multiple color resistive layers of different colors are arranged on the first substrate plate or the second substrate plate periodically, and the grid pitches of the different WG structures corresponding to the color resistive layers of different colors are the same.

The second substrate plate may comprise a base and a TFT array, and the TFT array is disposed at the side of the base towards the first substrate, and the wire grid polarizer is disposed at the side of the base away from the first substrate plate; or the wire grid polarizer may be disposed between the TFT array and the base, and an insulating layer may be disposed between the wire grid polarizer and the TFT array.

The side of the first substrate plate away from the second substrate plate may further be provided with a matching polarizer, and the polarization axis of the matching polarizer may be disposed orthogonally to the polarization axis of the polarizer.

An embodiment of the invention also provide a display device, comprising a display panel and a backlight source, wherein, the display panel is the display panel described above.

Due to the wire grid polarizer according to the embodiment of the invention being provided with WG structures arranged at intervals in an array, a local light transmitting area can be formed, so that the emergence of the light beam can be controlled more flexibly.

The display panel using the wire grid polarizer according the embodiment of the invention can lower the light absorption rate effectively, avoid peripheral light leakage in the non-subpixel area, and prevent the light leakage of the pixels themselves, and moreover the technical solution is a simple and feasible, and easy to be implemented.

Correspondingly, the display device adopting the display panel can improve the light utilization rate, and achieve a good display effect.

DETAILED DESCRIPTION OF SPECIFIC EMBODIMENTS

To make those skilled in the art to better understand the technical solution of the invention, a wire grid polarizer and a manufacturing method thereof, a display panel and a display device of the invention are further described in detail in connection with the figures and specific embodiments.

Embodiment 1

The embodiment provides a wire grid polarizer, which has wire grid structures arranged at intervals, thus forming local light transmitting areas, so as to be able to control the emergence of light beams.

Figure 1:
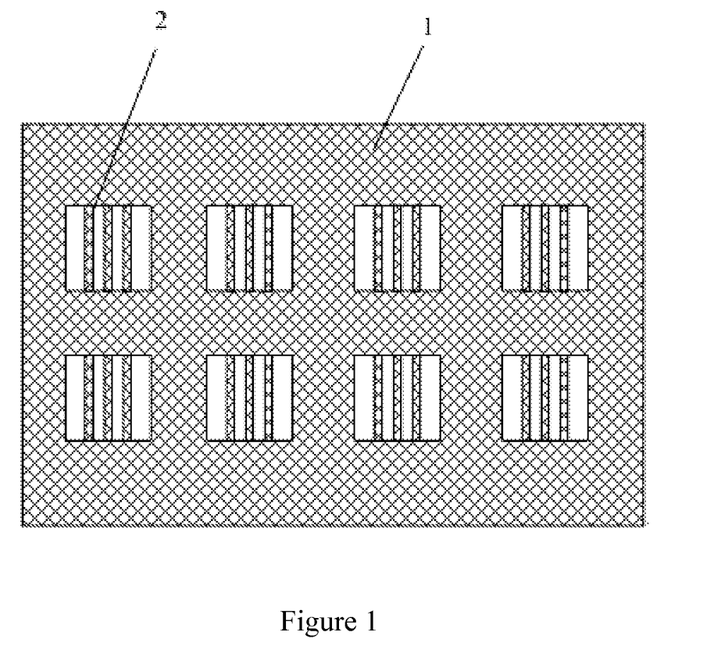
FIG. 1 is a structural diagram of a wire grid polarizer in embodiment 1 of the invention.

As shown in FIG. 1, the wire grid polarizer comprises a substrate 1, on which are formed multiple open areas arranged at intervals in an array. The wire grid polarizer also comprises multiple WG structures 2 disposed in the multiple open areas respectively, each of the WG structures 2 comprising multiple grid lines arranged at intervals, the intervals between two adjacent grid lines forming the grid pitches of the WG structures 2. Due to the WG structures 2, light can penetrate through the grid pitches of the WG structures 2. The area, except the open areas, of the substrate is a continuous opaque area.

The thickness of the substrate 1 ranges 20-250 nm. Preferably, in the WG structures 2, the width of the grid lines ranges 25-250 nm, and the width of the grid pitches ranges 25-250 nm. As a preferred implementation of the invention, the substrate 1 and the WG structures 2 are formed into a whole, wherein, the thickness of the grid lines and the thickness of the substrate 1 are the same.

To ensure the intensity of the wire grid polarizer and the recycling of the light reflection of the opaque area, the substrate 1 is formed with a metal material, for example aluminum or silver.

Correspondingly, the embodiment also provides a manufacturing method of the wire grid polarizer described above, which includes the following steps S1 to S7.

Step S1, a transparent supporting layer is formed on a base.

In this step, a transparent glass material or resin material is used as the base, on which is formed the supporting layer. The material forming the supporting layer may comprise any one of polymethyl methacrylate, polycarbonate, polystyrene, cycloolefin resin or cross-linked polyethylene, and the supporting layer may be formed by spin coating, with the thickness of the supporting layer ranging 0.1-0.3 μm.

Step S2, the supporting layer is heated to make the temperature of the supporting layer higher than the temperature of the glass phase transition point of the supporting layer.

Preferably, in step S1, the supporting layer is formed with polymethyl methacrylate, of which the temperature of the glass phase transition point is 105° C.; in this step, the heating temperature of the supporting layer may range 180-220° C., and preferably is 200° C.

Step S3, a pressing template is pressed into the supporting layer with a preset pressure, the pressing template being prefabricated with pressing patterns corresponding to the patterns of the WG structures at intervals.

It is easy to understand that, herein, the meaning of the correspondence of the so-called pressing patterns to the patterns of the WG structures is that, the pressing patterns are provided with both a graph corresponding to the grid lines of the WG structures, and a graph corresponding to the grid pitches of the WG structures. Moreover, the locations of the pressing patterns in the pressing template corresponds to the locations of the WG structures in the wire grid polarizer. That is to say, the pressing patterns are also arranged in an array.

The pressing template is preformed. In this step, the pressing template is formed with a silica material, with the width of the portions, corresponding to the grid lines of the WG structures, of the pressing patterns of the pressing template ranging 25-250 nm, the width of the portions, corresponding to the grid pitches of the WG structures, of the pressing patterns of the pressing template ranging 25-250 nm, and the depth of the portions, corresponding to the grid pitches of the WG structures, of the pressing patterns of the pressing template ranging 20-250 nm. The preset pressure ranges 12-14 MPa, preferably is 13.1 Mpa. At this time, since the temperature of the polymethyl methacrylate in the template is higher than its glass phase transition point, the polymethyl methacrylate is present in a viscous liquid state, and can flow under pressure.

Step S4, the preset pressure is maintained, the supporting layer is cooled down below the temperature of the glass phase transition point of the supporting layer, and the pressing template is removed, forming raised areas and depressed areas are on the supporting layer, with the raised areas corresponding to the grid pitches, and the depressed areas including portions corresponding to the grid lines and a portion corresponding to the continuous opaque area.

In this step, after the temperature of the supporting layer is below 105° C., making the polymethyl methacrylate to coagulate into a solid since it is below the temperature of its glass phase transition point, the pressing template is removed. Due to the hydrophilic character of polymethyl methacrylate, it will not stick to the silica template, and the pressing template can be uplifted to demould.

Step S5, the portions, corresponding to the depressed areas, of the supporting layer are removed, to expose the base of corresponding areas, so that masking patterns the same as the patterns of the WG structures 2 are formed on the base by using the supporting layer;

In this step, the supporting layer may be etched by using reactive ion etching (RIE for short), until the depressed areas, corresponding to the grid lines of the WG structures 2 and the continuous opaque area, in the supporting layer are removed, so as to expose the base of the corresponding areas, that is to obtain the periodic patterns the same as the WG structures.

Step S6, by using a metal material for forming the substrate 1, a opaque material layer is formed on the exposed base and the masking patterns;

In this step, the opaque material may be a metal material, which may include aluminum or silver, and an aluminum layer or silver layer may be formed by sputter deposition. It may be understood that, at this time the opaque material is attached onto both the corresponding areas exposed on the base, and the masking patterns.

Step S7, the masking patterns and the opaque material attached onto the masking patterns are removed, so as to form the wire grid polarizer.

In this step, the masking patterns and the opaque material attached onto the masking patterns may be removed by dissolution, to form the wire grid polarizer.

The wire grid polarizer of this embodiment, due to its WG structures arranged at intervals, can form local light transmitting areas. The arrangement of the WG structures can be designed flexibly according to the needs, to control the emergence of the light beams flexibly.

Embodiment 2

This embodiment provides a display panel comprising the wire grid polarizer of embodiment 1. The display panel can effectively reduce the light absorption rate, and can also avoid the peripheral light leakage in a non-subpixel area, thus having a better display effect.

Figure 2:
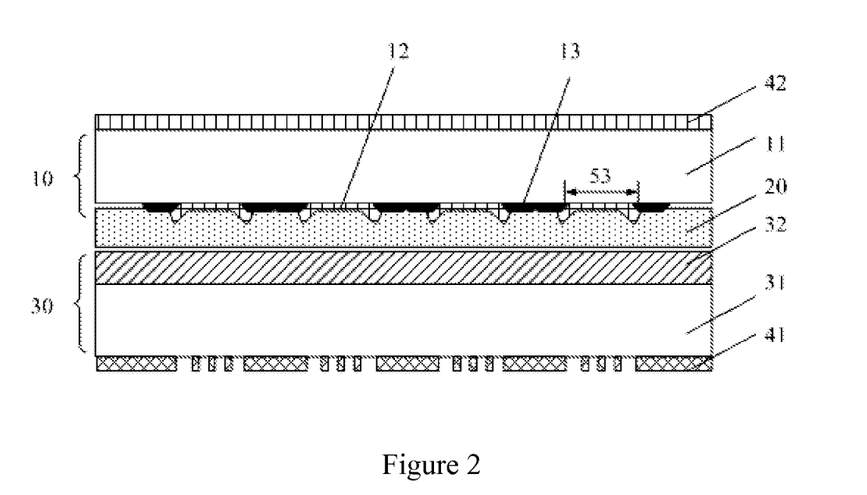
FIG. 2 is a structural diagram of a display panel in embodiment 2 of the invention.
Figure 3:
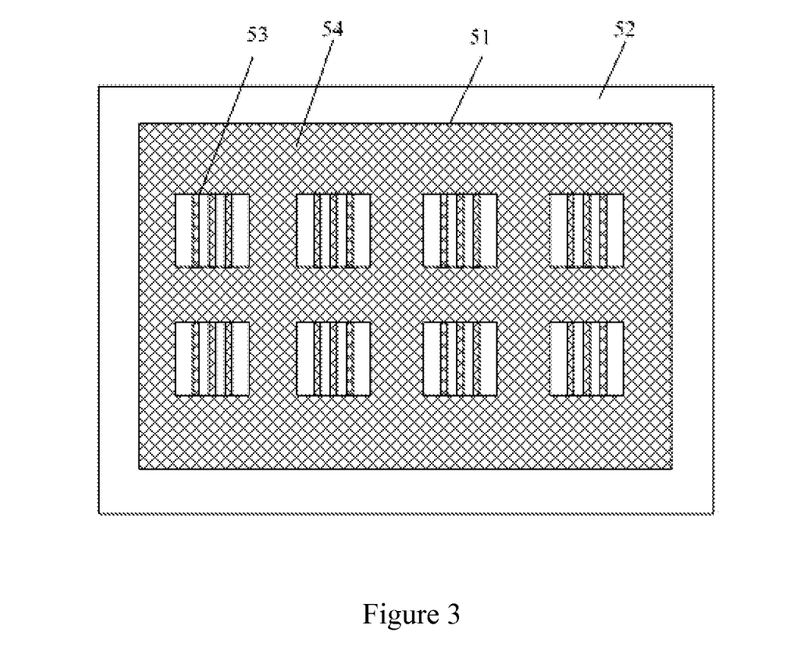
FIG. 3 is a structural diagram of a polarizer of the display panel shown in FIG. 2.

As shown in FIG. 3, the display panel comprises an active area 51 (AA for short) and an inactive area 52 surrounding the AA, that is, the AA 51 is surrounded within the inactive area 52; in the meantime, referring to FIG. 2, the area corresponding to the AA 51 in the display panel is provided with a polarizer 41, which is the wire grid polarizer with WG structures in embodiment 1.

The AA 51 includes multiple subpixel areas 53 arranged at intervals, and the areas corresponding to the subpixel areas 53 in the polarizer 41 are the WG structures, while the other area is a metal thin film structure, that is, the area corresponding to the non-subpixel area 54 is a continuous plate structure. The non-subpixel area refers to the area other than the subpixel area 53 in the AA 51. Using the wire grid polarizer of embodiment 1 as the polarizer 41, local WG structures are formed in this display panel, that is, the WG structures are formed in the areas corresponding to the subpixel areas 53 used for display, while the whole plate of the metal thin film is still maintained in the area of the non-subpixel area 54 not used for display between the subpixel areas 53.

As shown in FIG. 2, the display panel comprises a first substrate plate 10 and a second substrate plate 30 disposed opposite to each other, and the areas, corresponding to the sub-pixel areas 53, of the first substrate plate or the second substrate plate 30 are provided with multiple color film patterns in different colors, with the WG structures corresponding one-to-one to the color film patterns, thus the light beams penetrating from the grid pitches of the WG structures can penetrate through the color film patterns. By the local WG structures, that is, the polarizer 41 being set to form the WG structures only in the areas corresponding to the subpixel areas 53, while the area corresponding to the non-subpixel area 54 maintaining the whole plate of the metal thin film, the problem of low light utilization rate can be solved, and normal display of images can be ensured.

In the invention, the meaning of the WG structures corresponding one-to-one to the color film patterns is that one WG structure corresponds to one color film pattern.

It should be understood by those skilled in the art that, such a display panel may comprise color film patterns with three different colors, and a pixel unit is formed by three subpixel areas arranged sequentially, the three sub-pixel areas corresponding to the color film patterns with different colors respectively. The display panel may also comprise color film patterns with four different colors, and a pixel unit is formed by the four subpixel areas arranged sequentially, the four subpixel areas corresponding to the color film patterns with different colors respectively.

Since normal wire grid polarizers use an overall WG structure in the prior art, the areas corresponding to the sub-pixel areas 53 and the non-subpixel area 54 are all a structure with alternating light and dark stripes, which will cause peripheral light leak in the non-subpixel area 54, thus affecting the display effect. Compared with the prior art, the display panel provided by the embodiment of the invention uses a polarizer with the local WG structures, which, while lowering the light absorption rate, further lowers the peripheral light leakage of the non-subpixel area, and effectively prevents the light leakage of the pixel themselves.

In the invention, there is no limit to the specific structures of the color film patterns. For example, a color film pattern may comprise a color resistive layer 12 (that is, the structure of the color film pattern is the color resistive layer), and correspondingly, the display panel comprises multiple color resistive layers 12 with different colors. For example, the display panel may comprises multiple red color resistive layers, multiple green color resistive layers and multiple blue color resistive layers. Each of the color resistive layers corresponds to one subpixel area. The color resistive layers of multiple different colors are arranged on the first substrate plate or the second substrate plate periodically. For example, multiple different color resistive layers may form a color resistive unit (one color resistive unit corresponds to one pixel unit) with a red color resistive layer, a green color resistive layer and a blue color resistive layer, and multiple color resistive units may be arranged on each display panel.

In the invention, the grid pitches of the different WG structures corresponding to the color resistive layers of different colors can be different. For example, the grid pitch of the WG structures corresponding to the red color resistive layers may be different from the grid pitch of the WG structures corresponding to the green color resistive layers.

To facilitate manufacture, the grid pitches of the different WG structures corresponding to the color resistive layers 12 of different colors respectively are the same. That is, the wire grid periods (i.e., the sum of the widths of a grid line and a grid pitch) of the WG structures corresponding to the multiple color resistive layers 12 of different colors are the same, so as to simplify the manufacture process of the WG structures in the polarizer 41.

For example, the grid pitch of the WG structures corresponding to the red color resistive layers is equal to the grid pitch of the WG structures corresponding to the green color resistive layers, and is also equal to the grid pitch of the WG structures corresponding to the blue color resistive layers.

The polarizer 41 is formed with an opaque material, preferably a metal material, such as aluminum or silver. Aluminum or silver has good refractive index and good intensity, and using aluminum or silver to form polarizer 41 with WG structures, can not only ensure no peripheral light leakage in the subpixel area, but also ensure the intensity of the polarizer; further, the polarizer with the local WG structures disposed in the display panel described above can reflect back part of the light that is not absorbed, such that the light absorbed by the polarizer are only around 10%, thus the light absorption rate is significantly lowered.

Correspondingly, the WG structures of the polarizer 41 may be formed by a combination of a photolithographic process and a nano-imprint process used to form the wire grid polarizer in embodiment 1, then the polarizer 41 and the display substrate plate may be formed as a whole; or, they may also be formed on one side of the second substrate plate directly by a patterning process. The combination of a photolithographic process and a nano-imprint process and the patterning process described above are both relatively mature, and have a high process level currently, thus can ensure the yield rate of the polarizer 41.

Preferably, the wire grid period of the WG structures ranges 50-500 nm, the width of the grid lines ranges 25-250 nm, and the width of the grid pitches ranges 25-250 nm.

Preferably, the side of the first substrate plate 10 away from the second substrate plate is also provided with a matching polarizer 42, of which the polarizing axis is disposed orthogonally to the polarizing axis of the polarizer 41, thus only the light beams vibrating in specific directions can pass through, achieving image display.

In the display panel of the embodiment, the first substrate plate 10 comprises a first base 11, of which the area corresponding to the non-subpixel area 54 is provided with a black matrix 13. Since the subpixel areas 53 are arranged at intervals in the shape of a matrix, the black matrix 13 is formed in the shape of a grid, with the color resistive layers 12 of different colors in the color film patterns being disposed in the grid in turn cyclically. Correspondingly, the area, corresponding to the black matrix 13, of the second substrate plate 30 is provided with scan lines and data lines disposed in crisscross (not shown in the figures of the embodiment). Using the plate structures of the subpixel areas 53 of the polarizer 41 in the embodiment, in combination with the black matrix 13, the scan lines and the data lines, can prevent peripheral light leakage of the non-subpixel area, further preventing light leakage of the display panel.

In the display panel of the embodiment, an LC layer 20 is disposed between the first substrate plate 10 and the second substrate plate 30, and the inner surfaces of the first substrate plate 10 and the second substrate plate 30 are manufactured with an orientation layer (not shown in FIG. 2) respectively, thus the first substrate plate 10 and the second substrate plate 30 can be aligned (with an LC layer 20 inbetween). The periphery of the LC layer 20 is sealed with sealant, and the distance between the first substrate plate 10 and the second substrate plate 30 may be controlled by setting a spacer.

In the display panel of the embodiment, as shown in FIG. 2, the second substrate plate 30 comprise a second base 31 and a TFT array 32 disposed at the side of the second base 31 towards the LC layer 20, with the polarizer 41 disposed at the side of the second base 31 away from the LC layer 20. That is, the polarizer 41 with WG structures is arranged away from the first substrate plate 10, at the side of the second substrate plate 30 away from the LC layer 20. The polarizer 41 only has the metal layer of the areas corresponding to the subpixel areas 52 formed as WG structures, with the size of the area involving a WG structure being equal to the size of the area of a subpixel area 53, while the area corresponding to the non-subpixel area 54 maintaining a whole plate of the metal thin film. Herein, the TFTs of the TFT array 32 can be a top gate type or a bottom gate type.

The rest layer structures of the display panel and the manufacturing process thereof in the embodiment may be the same as the respective layer structures and the manufacturing process thereof in the prior art, thus further details are omitted herein.

In the working process of the display panel, in the areas corresponding to the subpixel areas 53, light beams can be transmitted from the WG structures, and arrive at the color resistive layers 12 with multiple different colors, corresponding to the subpixel areas 53, of the first substrate plate 10. Since the area corresponding to the non-subpixel area 54 maintains the plate-form metal thin film, the light beams cannot transmitted because they are blocked by the plate form metal thin film, thus the incident light can only be transmitted after it has arrived at the subpixel areas 53 through several times of reflections, and arrive at the color resistive layers 12 of multiple different colors corresponding to the subpixel areas 53 of the first substrate plate 10. Thus, the technical problem of low light utilization rate can be solved effectively, and peripheral light leakage in the non-subpixel area 54 can also be avoided, the light leakage of the pixels themselves can be lowered, and the light leakage can be prevented fundamentally.

In the display panel of the embodiment, the polarizer close to side of the backlight source, by means of the local WG structures, can lower the light absorption rate effectively, and in the meantime the peripheral light leakage in the non-subpixel area and the light leakage of the pixels themselves can be avoided, and moreover this technical solution is simple and feasible, and is easy to be implemented.

Embodiment 3

The embodiment provides a display panel, in which, compared with embodiment 2, the setting location of the polarizer is different from the setting location of the polarizer in the display panel of embodiment 2. This display panel can lower the light absorption rate effectively, and avoid the peripheral light leakage in the non-subpixel area, achieving a good display effect.

Figure 4:
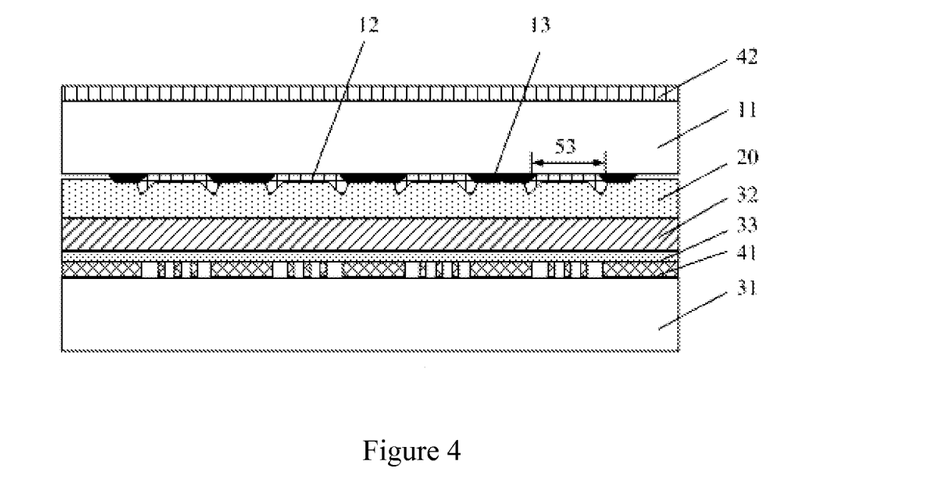
FIG. 4 is a structural diagram of a display panel in embodiment 3 of the invention.

In the display panel of the embodiment, the polarizer is disposed relatively above the array substrate plate. As shown in FIG. 4, the polarizer 41 is disposed between the TFT array 32 and the second base 31, and an insulating layer 33 is disposed between the polarizer 41 and the TFT array 32. The insulating layer 33 is formed above the polarizer 41 to isolate the polarizer 41 from the TFT array 32, so as to avoid the control functions of the TFT array 32 being affected by the metal forming the polarizer 41. Herein, the TFTs of the TFT array 32 can be a top gate type or a bottom gate type.

The rest layer structures of the display panel and the manufacturing process thereof in the embodiment may be the same as the respective layer structures and the manufacturing process thereof in embodiment 2, thus further details are omitted herein.

The working principle of the display panel of this embodiment is the same as the working principle of the display panel of the embodiment 2. Such a display panel can lower the light absorption rate effectively, and meanwhile avoid the peripheral light leakage in the non-subpixel and the light leakage of the pixel themselves, and moreover the technical solution is simple and feasible, and easy to be implemented.

Embodiment 4

The embodiment provides a display device, which comprises a display panel and a backlight source, the display panel being the display panel of embodiment 2 or embodiment 3.

Figure 5:
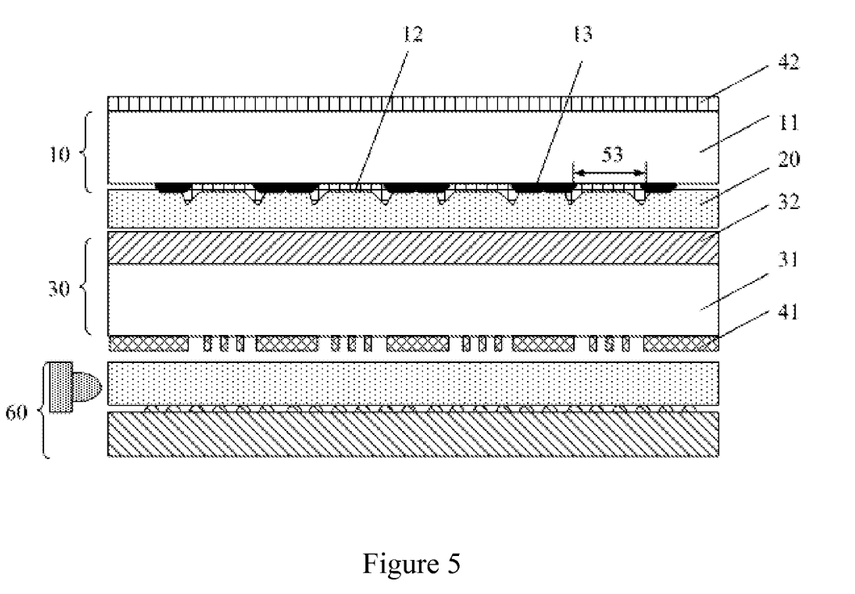
FIG. 5 is a structural diagram of a display device in embodiment 4 of the invention.

In the display device of the embodiment, the backlight source may be either straight down type or side light type. FIG. 5 shows a backlight source of side light type as an example. The backlight source 60 herein comprises multiple components such as a reflection board, a light guide plate, an LED light, and since a backlight source of the prior art may be adopted directly, further details are omitted herein.

In general, a backlight source comprises a reflection board or a reflection plate. In cooperation with such a reflection board or reflection plate, part of the light reflected by the polarizer 41 in the display panel discussed above can be reused, thus reducing the loss of light loss, and improving the light utilization rate.

Such a display device can be any product or component with display function, such as an LC panel, electronic paper, cell phone, tablet, TV, display, laptop, digital frame, GPS and so on.

Due to the display device adopting the display panel with low light absorption rate and good light leakage preventing effect discussed above, the light utilization rate is improved, and a good display effect is achieved; meanwhile it has the advantages of a lower cost and a small thickness.

It can be understood that, the implementations above are only exemplary implementations adopted to illustrate the principle of the invention, without limiting the invention. For those ordinary skilled in the art, various modifications and improvements can be made without departing from the spirit and the substance of the invention, and these modifications and improvements should be deemed as within the protection scope of the invention.

What is claimed is:

1. A wire grid polarizer, comprising a substrate, wherein multiple open areas are formed at intervals in an array on the substrate, the wire grid polarizer further comprises multiple wire grid structures arranged in the open areas respectively, each of the wire grid structures comprises multiple grid lines disposed at intervals, the intervals between two adjacent grid lines form grid pitches of the wire grid structures, and the wire grid structures allow light to penetrate through the grid pitches thereof, another area except the open areas of the substrate is a continuous opaque area, and the wire grid polarizer is disposed at a side of a base of a substrate plate comprising the base and a TFT array, opposite to the TFT array.

2. The wire grid polarizer of claim 1, wherein, in the wire grid structures, a width of the grid lines ranges between 25-250 nm, and a width of the grid pitches ranges between 25-250 nm.

3. The wire grid polarizer of claim 1, wherein, the substrate is made of a metal material.

4. The wire grid polarizer of claim 3, wherein, the metal material comprises silver or aluminum.

5. The wire grid polarizer of claim 1, wherein, the wire grid structures are formed with the substrate as a whole, a thickness of the substrate ranges between 20-250 nm, and a thickness of the grid lines of the wire grid structure ranges between 20-250 nm.

6. A display panel, comprising an active area which comprises multiple sub-pixel areas arranged at intervals, and an inactive area surrounding the active area, wherein the area of the display panel corresponding to the active area is provided with the wire grid polarizer described in claim 1, the areas of the wire grid polarizer corresponding to the sub-pixel areas are the wire grid structures, the display panel comprises a first substrate plate and a second substrate plate arranged opposite to one another, the second substrate plate comprises a base and a TFT array, the TFT array is disposed at a side of the base towards the first substrate plate, and the wire grid polarizer is disposed at a side of the base away from the first substrate plate.

7. The display panel of claim 6, wherein, the areas, corresponding to the sub-pixel areas, of the first substrate plate or the second substrate plate are provided with multiple color film patterns of multiple different colors, and the wire grid structures correspond one-to-one to the color film patterns.

8. The display panel of claim 7, wherein, the color film patterns comprise color resistive layers, multiple color resistive layers of different colors are arranged on the first substrate plate or the second substrate plate periodically, and the grid pitches of the different wire grid structures corresponding to the color resistive layers of different colors are the same.

9. The display panel of claim 8, wherein, the side of the first substrate plate away from the second substrate plate is further provided with a matching polarizer, and a polarization axis of the matching polarizer is disposed orthogonally to a polarization axis of the polarizer.

10. A display device, comprising a display panel and a backlight source, wherein, the display panel is the display panel described in claim 6.

11. The display panel of claim 6, wherein, in the wire grid structures, a width of the grid lines ranges between 25-250 nm, and a width of the grid pitches ranges between 25-250 nm.

12. A method for manufacturing a wire grid polarizer comprising a substrate, wherein multiple open areas are formed at intervals in an array on the substrate, the wire grid polarizer further comprises multiple wire grid structures arranged in the open areas respectively, each of the wire grid structures comprises multiple grid lines disposed at intervals, the intervals between two adjacent grid lines form grid pitches of the wire grid structures, and the wire grid structures allow light to penetrate through the grid pitches thereof, and another area except the open areas of the substrate is a continuous opaque area, the manufacturing method comprising:

Step S1, forming a transparent supporting layer on a base;
Step S2, heating the supporting layer to make a temperature of the supporting layer higher than a temperature of a glass phase transition point of the supporting layer;
Step S3, pressing a pressing template into the supporting layer with a preset pressure, the pressing template being prefabricated with pressing patterns corresponding to patterns of the wire grid structures disposed at intervals;
Step S4, maintaining the preset pressure, cooling the supporting layer down below the temperature of the glass phase transition point of the supporting layer, removing the pressing template, and forming raised areas and depressed areas on the supporting layer, with the raised areas corresponding to the grid pitches, with the depressed areas comprising portions corresponding to the grid lines and a portion corresponding to the continuous opaque area;
Step S5, removing portions of the supporting layer corresponding to the depressed areas to expose the base of corresponding areas, thus forming masking patterns on the base having the same patterns as the wire grid structures using the supporting layer;
Step S6, forming a layer of opaque material on an exposed base and the masking patterns; and
Step S7, removing the masking patterns and the opaque material attached on the masking patterns, so as to form the wire grid polarizer.

13. The manufacturing method of claim 12, wherein, in Step S1, the material forming the supporting layer comprises any one of polymethyl methacrylate, polycarbonate, polystyrene, cycloolefin resin and cross-linked polyethylene, the supporting layer is formed by spin coating, and a thickness of the supporting layer ranges between 0.1-0.3 μm.

14. The manufacturing method of claim 13, wherein, in Step S1, the supporting layer is formed with polymethyl methacrylate, a temperature of the glass phase transition point of which is 105° C.; and in Step S2, a heating temperature of the supporting layer ranges between 180-220° C.

15. The manufacturing method of claim 13, wherein, in Step S3, the pressing template is formed with a silica material, a width of the portions, corresponding to grid lines of the wire grid structures, of the pressing patterns of the pressing template ranges between 25-250 nm, and a width of the portions, corresponding to grid pitches of the wire grid structures, of the pressing patterns of the pressing template ranges between 25-250 nm, the depth of the portions, corresponding to the grid pitches of the wire grid structures, of the pressing patterns of the pressing template ranges between 20-250 nm; and a preset pressure ranges between 12-14 MPa.

16. The manufacturing method of claim 12, wherein, in Step S5, the supporting layer is etched by means of oxygen reactive ion etching, until the depressed areas, corresponding to the grid lines and the continuous opaque area of the wire grid structures, of the supporting layer expose the base of the corresponding areas.

17. The manufacturing method of claim 12, wherein, in Step S6, the opaque material is a metal material, and the opaque material layer is formed above the supporting layer by sputter deposition.

18. The manufacturing method of claim 17, wherein, the metal material comprises aluminum or silver, and an aluminum layer or a silver layer is formed above the supporting layer by sputter deposition.

19. The manufacturing method of claim 12, wherein, in Step S7, the masking patterns and the opaque material attached onto the masking patterns are removed by dissolution, so as to form the wire grid polarizer.

* * * * *